United States Patent [19]
Kim

[11] Patent Number: 5,844,832
[45] Date of Patent: Dec. 1, 1998

[54] CELL ARRAY STRUCTURE FOR A FERROELECTRIC SEMICONDUCTOR MEMORY AND A METHOD FOR SENSING DATA FROM THE SAME

[75] Inventor: Yun-Gi Kim, Weonju, Rep. of Korea

[73] Assignee: Samsung Electronics Co., Ltd., Suwon, Rep. of Korea

[21] Appl. No.: 916,207

[22] Filed: Aug. 22, 1997

[30] Foreign Application Priority Data

Aug. 22, 1996 [KR] Rep. of Korea .................. 1996 34910
Jul. 28, 1997 [KR] Rep. of Korea .................. 1997 35452

[51] Int. Cl.[6] ................................................. G11C 11/22
[52] U.S. Cl. ............................................ 365/145; 365/210
[58] Field of Search .............................. 365/145, 189.01, 365/230.01, 210

[56] References Cited

U.S. PATENT DOCUMENTS 5,640,030  6/1997  Kenney ..................................... 365/145

*Primary Examiner*—Terrell W. Fears
*Attorney, Agent, or Firm*—Jones & Volentine, L.L.P.

[57] ABSTRACT

A ferroelectric semiconductor random access memory (RAM) is disclosed, which comprises a memory cell array having a plurality of memory cells arranged in a matrix, each of the memory cells having an access transistor and a ferroelectric capacitor, a plurality of bit lines of open bit line structure connected with corresponding sense amplifiers, and a plurality of reference cells arranged symmetrically against the sense amplifiers for providing reference voltage to the reference input terminals of the sense amplifiers toe sense the logical states of the data stored in the memory cells. In this device, the reference voltage is provided from one of the reference cells.

9 Claims, 6 Drawing Sheets

CELL ARRAY STRUCTURE FOR A FERROELECTRIC SEMICONDUCTOR MEMORY AND A METHOD FOR SENSING DATA FROM THE SAME

BACKGROUND OF THE INVENTION

The present invention concerns a semiconductor memory. More particularly, the present invention relates to a cell array structure for a ferroelectric semiconductor memory adapted for constructing a highly integrated circuit, and a method for sensing data from the same.

Generally, semiconductor memory fabrication technology has been developed to minimize chip size by increasing the integration density of a memory cell device while enhancing the capacity of the device. A ferroelectric semiconductor memory device improves the device capacity by using capacitors comprised of a ferroelectric material with electrical non-volatility. Conventional dynamic random access memories (DRAMs) use a non-ferroelectric dielectric material between the upper and lower electrodes of their storage capacitors. Ferroelectric semiconductor memory devices, e.g., ferroelectric random access memories (FRAMs) employ ferroelectric capacitors that use a ferroelectric material between the upper and lower electrodes. This ferroelectric material eliminates the data loss problem caused by current leakage. As a result, a ferroelectric semiconductor memory does not require a refresh operation.

In addition, ferroelectric semiconductor memories store information by exploiting invertible and residual polarization properties of the ferroelectric material, so that the read/write operation may be carried out at a high speed. Since the inversion of polarization is made by the spins of the electric dipoles in the ferroelectric material, the operating speed of the ferroelectric semiconductor memory is several thousand times faster than other nonvolatile semiconductor memory such as electrically erasable and programmable read only memories (EEPROMs) and Flash-EEPROMs. The operating speed of these devices may be further increased by optimizing their design, thus making them comparable to conventional DRAMs in speed. Furthermore, the voltage required for the inversion of polarization is about 2 to 5 V, making it possible for the memory to operate at a relatively low voltage.

FIG. 1 illustrates an equivalent circuit of a unit cell of a conventional ferroelectric semiconductor memory. As shown in FIG. 1, the unit cell comprises an access transistor 1 and a ferroelectric capacitor 2. The drain D of the access transistor is connected to a corresponding bit line B/L and the gate G of the access transistor 1 is connected with a word line W/L. One plate of the ferroelectric capacitor 2 is connected to the source S of the access transistor 1, while the other plate of the ferroelectric capacitor 2 is connected with a plate line PL.

The unit cell is generally fabricated on a single semiconductor substrate. The access transistor 1 is formed in the active region between the field oxide layers on the substrate by means of the conventional process for fabricating n-channel MOS transistors. The ferroelectric capacitor 2 is formed over the field oxide layer with an insulating layer between them. The ferroelectric capacitor 2 generally includes a lower electrode layer, a ferroelectric layer and an upper electrode layer deposited in sequence over the insulating layer. The three layers may be respectively composed of Pt, PZT (lead zirconate titanate) and Pt or Al. The upper electrode layer is connected to the plate line PL, and the lower electrode layer to the source of the transistor 1, as shown in FIG. 1. An example of the capacitor cell structure composed of an access transistor and PZT ferroelectric layer is disclosed in U.S. Pat. No. 5,189,594, issued to Kazuhiro Hoshiba, the contents of which are hereby incorporated by reference.

It is well known in this art that a ferroelectric capacitor stores data by exploiting the characteristics of the hysteresis loop, as illustrated in FIG. 2, where the horizontal axis represents the electric field intensity or voltage V, and the vertical axis represents the polarization or the amount of charge. In FIG. 2, $V_c$ represents a coercive voltage to invert the direction of polarization. The points on the hysteresis loop labeled "a" and "d" represent the storage of binary data "0" and "1," respectively.

In operation, if a positive saturation voltage greater than the coercive voltage $V_c$ is initially applied to the node DN of FIG. 1, the polarization or the amount of charge is increased from a starting point at point "a" (representing binary data "0"), through point "b" to point "c" along the loop, as shown in FIG. 2. Then, once the voltage at the node DN is returned to 0 V, the amount of charge decreases from point "c" only to point "d" along the loop. At this point, the data stored in the capacitor 2 then represents binary data "1" via the stabilized polarization or charges. In other words, from a starting point where binary data "0" is stored in the ferroelectric capacitor, the plate line PL is applied with 0 V and a positive pulse is applied to the node DN to store data "1" in the ferroelectric capacitor. Thereafter, the polarization is maintained at point "d" according to the characteristics of the hysteresis loop of the ferroelectric material and the binary data "1" remains stored in the ferroelectric capacitor.

Alternatively, if a negative saturation voltage lower than the coercive voltage $-V_c$ is applied to the node DN of FIG. 1, the polarization or the amount of charges is increased from a starting point at point "a" (representing binary data "0"), through point "e" to point "f" along the loop, as shown in FIG. 2. Thereafter, the amount of the charges is decreased from point "f" only to a point "a" along the loop with the voltage cut off from the node DN, so that the data stored in the capacitor 2 represents binary data "0", stabilized in the polarization or charges. In other words, from a starting point where binary data "0" is stored in the ferroelectric capacitor, the plate line PL is applied with a positive pulse and the node DN with $-V_c$ in order to store binary data "0."

In order to replace data "1" already stored in the capacitor 2 with data "0", the negative saturation voltage greater than the coercive voltage $-V_c$ is applied to the node DN of FIG. 1. In this situation, the polarization or the amount of charge changes from point "d" (representing binary data "1"), through points "e" and "f," back to point "a" along the loop (representing binary data "0").

In order to replace binary data "0" already stored in the capacitor 2 with binary data "1", the positive saturation voltage greater than the coercive voltage $V_c$ is applied to the node DN of FIG. 1. The polarization or the amount of charge then changes from point "a" (representing binary data "0"), through points "b" and "c," back to point "d" along the loop (representing binary data "1"). The ferroelectric capacitor 2 may then store stable binary data "1" or "0" without an additionally applied voltage.

Detection of the stored data is made by applying a voltage equal to or greater than the positive saturation voltage between both electrodes of the capacitor 2. The difference between the polarization or the amount of charge at point "d" (representing data "1") and that at point "c" is considerably smaller than the difference between the polarization or the amount of charges at point "a" (representing data "0") and that at point "c." These differences may be easily detected by the sensing circuit provided in the ferroelectric memory. The sense amplifier compares the reference voltage supplied from the reference cell with the voltage supplied from the memory cell to determine the logical state of the stored data as "1" or "0."

FIG. 3 illustrates a conventional semiconductor memory which comprises a plurality of sense amplifiers 300 and 310, a plurality of reference cell groups 20 and 21, a plurality of main cell groups 30 and 31, and a plurality of precharge and equalization circuits 10 and 11. This conventional semiconductor memory has an open bit line structure symmetrically arranged with respect to the sense amplifiers.

The plurality of reference cell groups 20 and 21 each comprise a plurality of reference cells and pass gates. The plurality of main cell groups 30 and 31 each comprise a plurality of main cells for storing data. The plurality of precharge and equalization circuits 10 and 11 act to precharge and equalize the bit lines. The precharge and equalization circuit 10, for example, comprises an equalizing transistor $Q_1$ for connecting the bit lines $BL_{a1}$ and $BL_{a2}$, and precharging transistors $Q_2$ and $Q_3$. In this case, the reference cells and main cells are fabricated using the same process as for the ferroelectric capacitors 2 included in the reference cell $RC_1$ and main cell $MC_1$, and have the same polarization.

If a memory arranged in one side of a sense amplifier 300 is selected to read data, the reference voltage is supplied to the corresponding bit line $BL_{b1}$ by the operation of the reference cells $RC_{11}$ and $RC_{21}$ arranged in the other side of the sense amplifier.

The operation of the conventional semiconductor memory will now be described with reference to FIG. 3, and using the example of reading the data stored in the memory cell $MC_1$ of the main cell group 30 arranged in one side of the sense amplifier 300. In this operation, the reference cells $RC_1$ an $RC_2$ are cut off while the reference cells $RC_{11}$ and $RC_{21}$ arranged in the other side of the sense amplifier 300 are operated to provide the bit line $BL_{b1}$ with the reference voltage. To this end, the reference cell data input terminals PFPRS*, PFPRS, RDIN*, and RDIN are provided respectively with logically high, low, high, and low signals.

In addition, the reference cell plate line $RPL_2$ is applied with 0 V.

Assuming the logically high signal has the level of about 5 V, and the low signal is 0 V, the pass gate $PG_{11}$ of the reference cell group 21 generates a positive voltage of about 5 V and the pass gate $PG_{21}$ generates a voltage of 0 V. If both of the reference cells $RC_{11}$ and $RC_{21}$ have the same polarization corresponding to point "a" in FIG. 2, the reference cell $RC_{11}$ changes the direction of polarization approaching point "c" along the loop of FIG. 2. Meanwhile, the reference cell $RC_{21}$ undergoes no change maintaining the same polarization at point "a."

The reference cell word line $RWL_2$ is then enabled to load the bit line $BL_{b1}$ with the voltage induced by the polarization change, e.g., about 5 V, and the adjacent bit line $BL_{b2}$ with 0 V. Then, the transistor $Q_1$ of the precharge and equalization circuit 11 is enabled by applying the equalization signal EQ at a high level to equalize the bit lines $BL_{b1}$ and $BL_{b2}$ to the same voltage level. In this case, the voltage level becomes 2.5 V which is in the middle of 0 V and 5 V so that the bit line $BL_{b1}$ is provided with about 2.5 V, which is applied as the reference voltage to the reference voltage input terminal of the tense amplifier 300.

Meanwhile, the word line $MWL_1$ and the plate line $MPL_1$ of the main memory cell $MC_1$ are applied with a logically high signal. If the memory cell $MC_1$ stores data "1," the direction of polarization is reversed, and the corresponding voltage of about 5 V is developed in the precharged upper bit line $BL_{a1}$. The corresponding voltage is then applied to the data input terminal of the sense amplifier 300 which compares the voltages of the two input terminals to amplify the voltage of the bit line $BL_{a1}$. The amplified voltage is transmitted through the data line D/01 when the transmission transistor $S_1$ is enabled by the logically high signal $C_{data}$. Hence, the data "1" is read from the memory cell $MC_1$.

Such conventional memory device suffers the drawbacks that a plurality of reference cells must be driven in order to read data from the main cells, and the reference cell bit lines must be equalized by applying external data to the reference cells. This results in a lagging of the operating speed. In addition the plurality of the precharge and equalization circuits connected with the reference cells and the pass gates comprising P-type and N-type MOS transistors complicate the structure of the semiconductor memory. Moreover, a peripheral logic circuit is required to apply external data to the plurality of reference cells. This serves as a limiting factor in reducing the chip size.

SUMMARY OF THE INVENTION

It is an object of the present invention to provide a ferroelectric semiconductor RAM with a cell array structure adapted to increase the integration density of the chip, and method for sensing data in such RAM.

It is another object of the present invention to simplify the structure of a Ram cell array.

It is still another object of the present invention to provide a ferroelectric semiconductor memory having a simple structure to speed up the read operation, and method for forming the corresponding reference cells.

It is a further object of the present invention to provide a ferroelectric semiconductor memory without the precharge and equalization circuits and pass gates According to an aspect of the present invention, a ferroelectric semiconductor Ram comprises a memory cell array having a plurality of memory cells arranged in a matrix, each of the memory cells consisting of against access transistor-and a ferroelectric capacitor, a plurality of bit lines of open bit line structure connected with corresponding sense amplifiers, and a plurality of reference cells arranged symmetrically against the sense amplifiers for providing reference voltage to the reference input terminals of the sense amplifiers to sense the logical states of the data stored in the memory cells, characterized in that the reference voltage is provided from one of the reference cells 11a.

According to another aspect of the present invention, a ferroelectric semiconductor memory comprises a plurality of sense amplifiers connected with corresponding bit lines of open bit line type, a plurality of ferroelectric memory cells arranged symmetrically against the sense amplifiers and connected between the bit lines and plate lines, a pair of reference cells arranged symmetrically against each of the sense amplifiers and connected with the bit lines so as to be outside the memory cells, each of the reference cells having a capacitor with a capacitance equal to half the polarization capacitance of the ferroelectric capacitor of the memory cell, characterized in that the reference voltage for the sense amplifier to sense the data of a selected memory cell in data read mode is supplied at the half level of a binary data from the reference cell opposite to the selected memory cell with respect to the sense amplifier. The reference cells may consist of ferroelectric capacitors or conventional MOS capacitors. In case of using the ferroelectric capacitor, the aperture size of the barrier layer between the ferroelectric layer and the upper electrode layer is adjusted to provide the reference voltage level.

Thus, the present invention provides a semiconductor memory without the precharge and equalization circuits and pass gates, increasing the integration density. Furthermore, the data input and equalization for the reference cells are not necessary, speeding up the data read/write operation.

The present invention will now be described more specifically with reference to the drawings attached only by way of example. In the drawings, same reference numerals are used to represent same functional elements. Detailed descriptions of the conventional part unnecessary for grasping the inventive concept arc omitted for convenience's sake.

DETAILED DESCRIPTION OF THE PREFERRED EMBODIMENT

Figure 4:
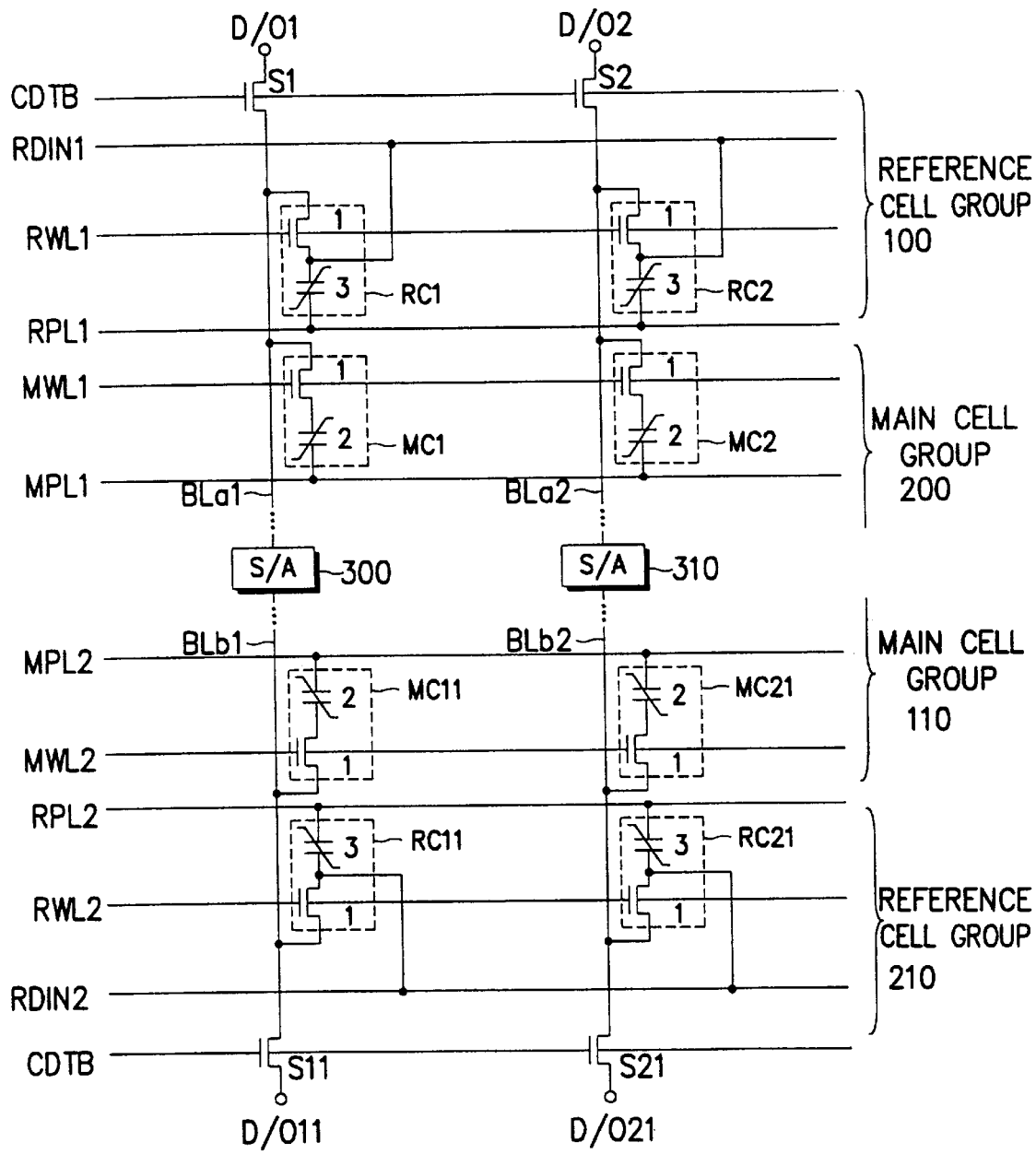
FIGS. 4 and 5 illustrate the cores of ferroelectric semiconductor memories according to a preferred embodiment of the present invention.

FIG. 4 illustrate the core of ferroelectric semiconductor memories according to a first preferred embodiment of the present invention. As shown in FIG. 4, sense amplifiers 300 and 301 connected with the bit lines of open bit line type memory. The sense amplifier 300 is connected between an upper bit line $BL_{a1}$ and a lower bit line $BL_{b1}$.

Figure 8:
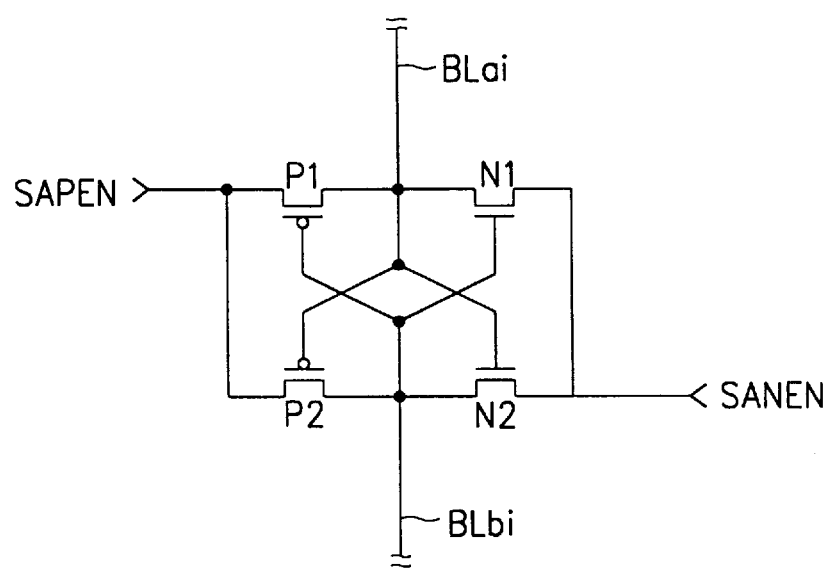
FIG. 8 is a diagram illustrating an example of a sense amplifier applied to a preferred embodiment of the present invention.

FIG. 8 discloses a preferred sense amplifier 300 and 301 to be used in the circuit of FIG. 4. The sense amplifiers 300 and 301 each have the same structure, which comprises, for example, a pair of cross-coupled P-type and N-type MOS transistors $P_1$ and $N_1$ and $P_2$ and $N_2$ to achieve the sensing scheme of a conventional inverter latch type, as shown in FIG. 8. The cross-coupled P-type and N-type MOS transistors function as an inverter. The reference symbols SAPEN and SANEN in FIG. 8 represent externally applied signals to enable data sensing.

Figure 5:
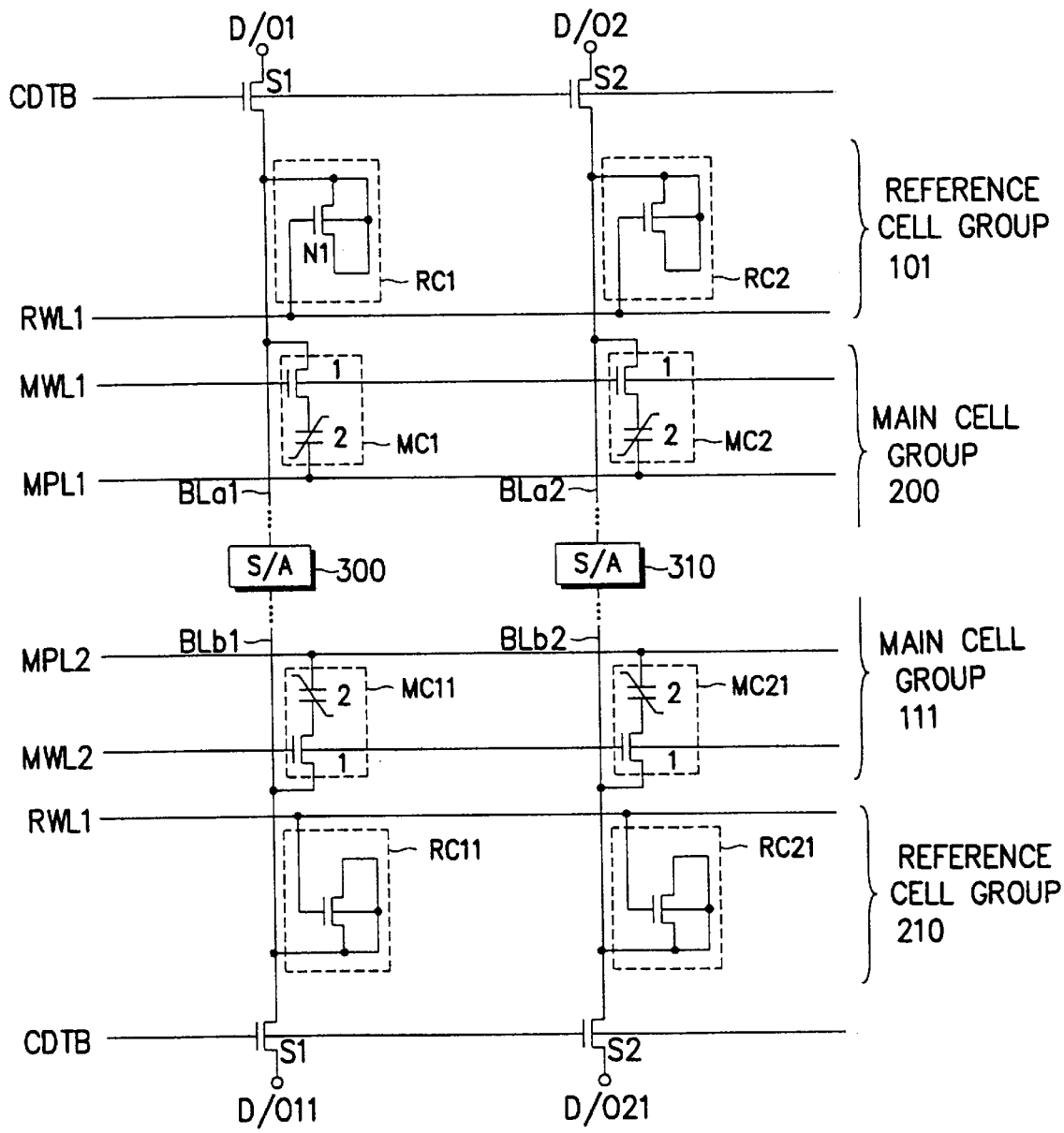

Ferroelectric memory cells $MC_1$ and $MC_{11}$ of FIG. 4 are arranged symmetrically with respect to the sense amplifier 300, connected between the bit lines and the plate lines $MPL_1$ and $MPL_2$. Each of the main cells $MC_1$, $MC_2$, $MC_{11}$, and $MC_{21}$ making up the main cell groups 200 and 210 comprises an access transistor 1 and a ferroelectric capacitor 2, having the same polarization. The reference cells $RC_1$, $RC_2$, $RC_{11}$, and $RC_{21}$ of the reference cell groups 100 and 110 are arranged symmetrically against corresponding sense amplifiers and are connected with the bit lines so as to be outside the memory cells as shown in FIGS. 4 and 5. The ferroelectric capacitor 3 of each of the reference cells $RC_1$, $RC_2$, $RC_{11}$, and $RC_{21}$ is fabricated to have a capacitance equal to half the polarization capacitance of the ferroelectric capacitor 2 of the memory cell. This allows the reference cell $RC_{11}$ opposite to a selected memory cell $MC_1$ with respect to the sense amplifier 300 to supply the reference voltage to the bit line $BL_{b1}$ at the half level of a binary data for the sense amplifier 300 to sense the data of the selected memory cell in a data read mode.

Figure 1:
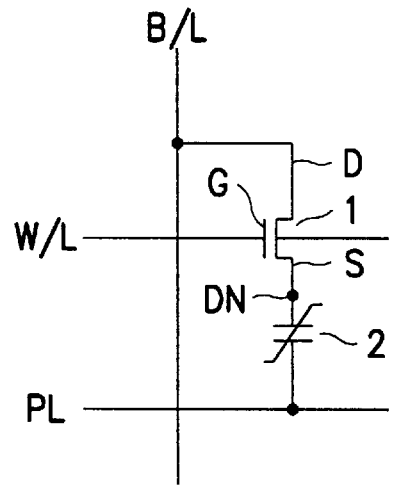
FIG. 1 is the equivalent circuit of a typical cell structure of a conventional ferroelectric semiconductor memory.
Figure 2:
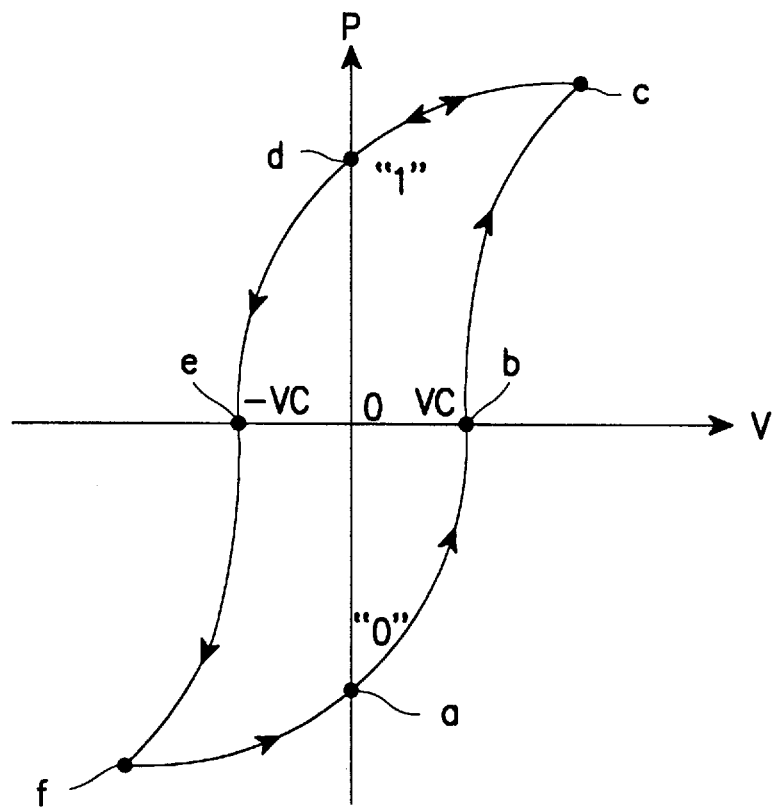
FIG. 2 is a diagram for illustrating the general hysteresis loop representing the characteristics of a ferroelectric material.
Figure 3:
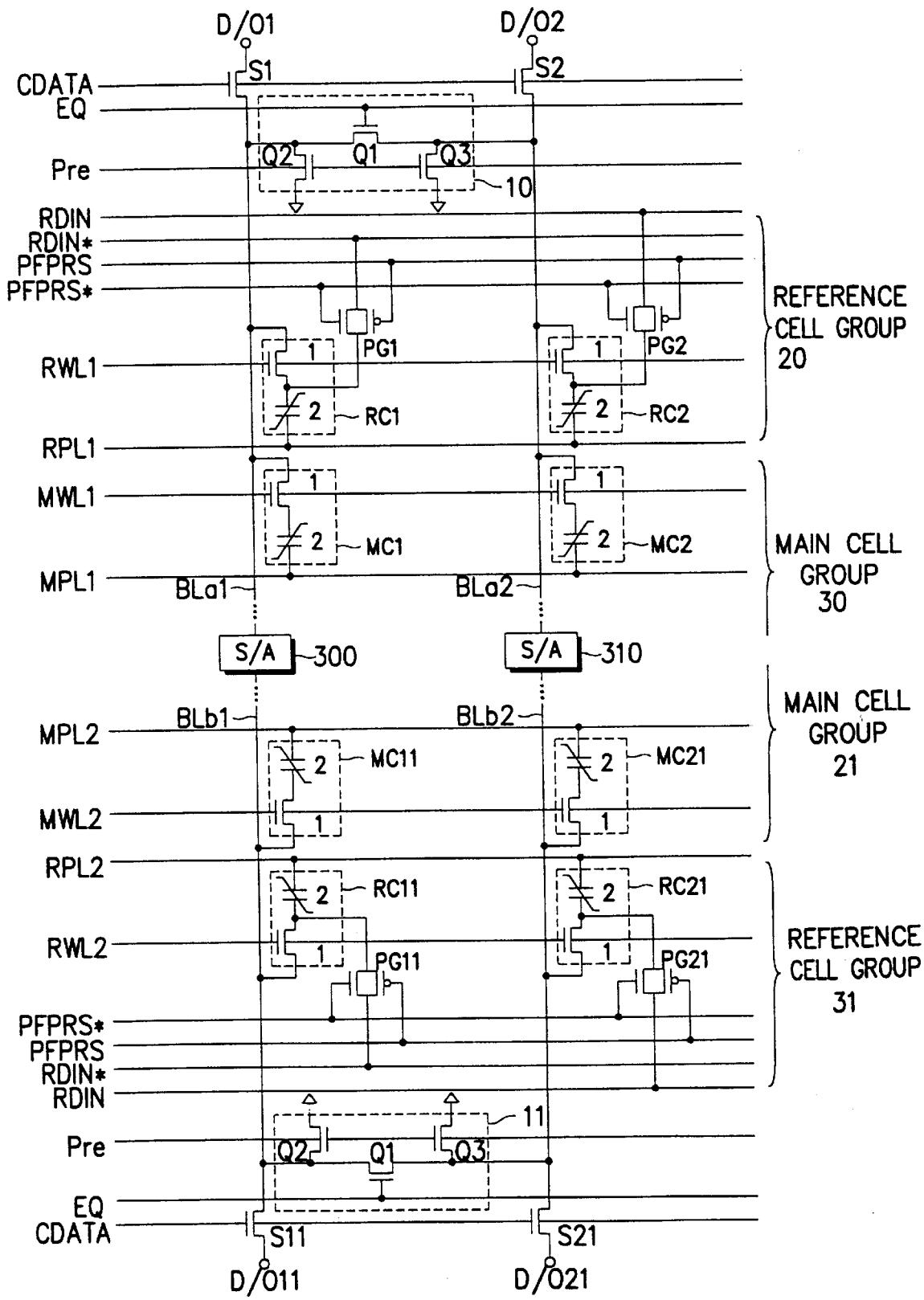
FIG. 3 illustrates the core of a conventional ferroelectric semiconductor memory.

Such difference in capacitance between the reference cell capacitor and the main cell capacitor serves to eliminate the conventional precharge and equalization circuits 10 and 11 the and pass gates $PG_1$, $PG_2$, $PG_{11}$, and $PG_{21}$ used in the conventional circuit of FIG. 3. As a result, the data input and equalization for the reference cell is not required, and the read/write operation is sped up.

Figure 6:
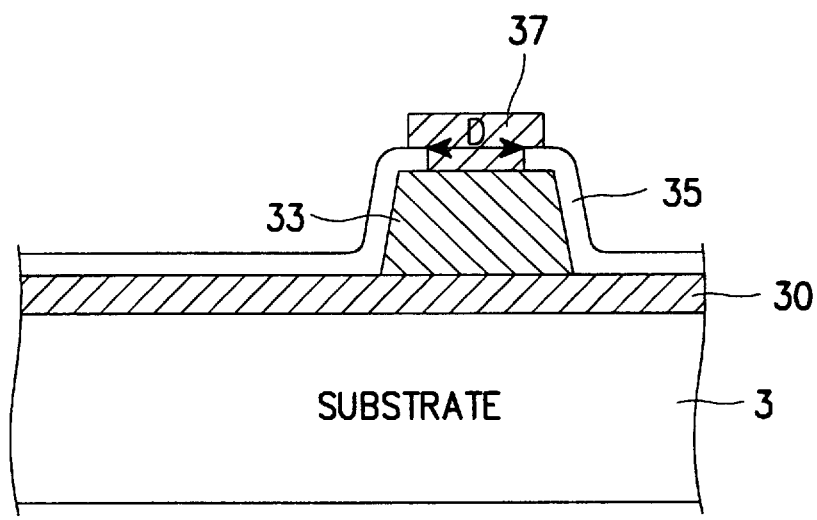
FIGS. 6 and 7 are cross sectional views for illustrating the fabrication of the reference cell capacitors shown in FIGS. 4 and 5.

The ferroelectric capacitor 3 of the reference cell $RC_1$, $RC_2$, $RC_{11}$, and $RC_{21}$ is fabricated in the same way as the ferroelectric capacitor 2 of the main cell, but the aperture size "D" formed in the barrier layer 35 is different, as shown in FIG. 6. The difference of the aperture size makes for a difference in the contact area between the ferroelectric layer 33 and the upper electrode layer 37, resulting in difference in polarization. The aperture size "D" should be adjusted for the capacitor 3 to have a polarization half the polarization of the capacitor 2.

As shown in FIG. 6, when the lower electrode layer 30 is formed by platinum with a thickness of about 3200 Å on the substrate 3, the ferroelectric layer 33 may be formed by PZT, preferably with a length of about 3.5 $\mu$m, and more preferably with a length of about 3.48 $\mu$m. The ferroelectric layer preferably has a thickness of about 2800 Å. The barrier layer 35 is a dielectric layer to protect the ferroelectric layer 33, and has the aperture to adjust the polarization. The upper electrode layer 37 is formed by platinum with a length of preferably to about 3 $\mu$m, and more preferably with a thickness of about 3.08 $\mu$m. The upper electrode layer preferably has a thickness of about 21 Å.

When reducing the aperture size, the capacitor 3 achieves a polarization of half the polarization of the capacitor 2 by applying data for inverting the data stored in the reference cell from "1" to "0" or vice versa to the reference input terminals $RDIN_1$ and $RDIN_2$. In this case, the invertible polarization of the reference cell is half the invertible polarization of the capacitor 2. The invertible polarization of the reference sell is set to have about 2.5 V. Alternatively, when increasing the aperture size of the capacitor 3 greater than that of the capacitor 2, the capacitor 3 achieves a polarization half the polarization of the capacitor 2 by applying data for maintaining the data stored in the reference cell to the reference input terminals $RDIN_1$ and $RDIN_2$ of FIG. 4. In this case, the polarization produced in the curve interval between point "d" and point "c" is only employed to obtain 2.5 V.

Figure 7:
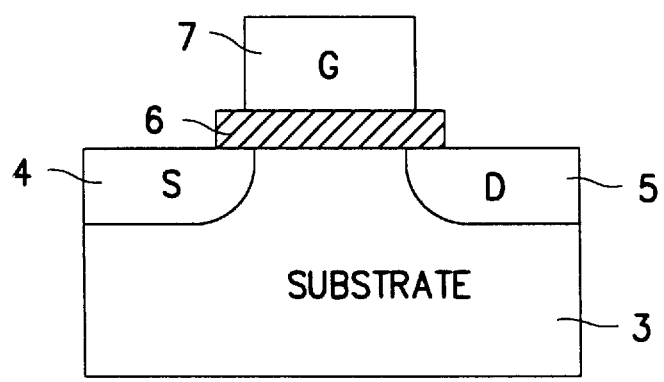

FIG. 5 illustrate the core of ferroelectric semiconductor memories according to a second preferred embodiment of the present invention. FIG. 5 has a similar structure as FIG. 4 except that the reference cell comprises a conventional MOS transistor $N_1$ and a conventional capacitor. As with the first preferred embodiment, the reference cell $RC_1$ is fabricated to have a capacitance half the polarization of the ferroelectric capacitor 2 of the main cell by adjusting the size and thickness of the gate oxide layer 6, as shown in FIG. 7. In this case, a direct bias should be applied to the gate 1, source 4 and drain 5 for a given time. The MOS transistor of FIG. 7 is fabricated substantially in the same way as a conventional MOS transistor.

The read operation for the memory device shown in FIG. 4 will now be described for reading data from the memory cell $MC_1$ of the memory cell group 200 arranged in one side of the sense amplifier 300. In this example, the reference cell has a reduced aperture size compared to the memory cell. During the read operation, the reference cells $RC_1$ and $RC_2$ are cut off while the reference cell $RC_{11}$ arranged in the other side of the sense amplifier 300 is only driven to supply the sensing reference voltage to the bit line $BL_{b1}$. Accordingly, the reference cell signal $RDIN_2$ of the reference cell group 110 becomes logically high. The reference cell word line $RWL_2$ is enabled for the bit line $BL_{b1}$ to have a voltage induced by the inverted polarization, e.g., about 2.5 V. In this way, the polarization of the capacitor 3 is half that of the capacitor 2. Therefore, the logical state of the main cell data, i.e., 2.5 V, which is the middle value between 0 V and 5 V, is supplied without equalization. Thus, the sensing reference voltage of about 2.5 V is supplied through the bit line $BL_{b1}$ to the reference level input terminal of the sense amplifier 300.

Meanwhile, the word line $MWL_1$ and plate line $MPL_1$ of the main memory cell $MC_1$ is applied with a high signal. If the memory cell $MC_1$ stores data "1", the direction of polarization is inverted to develop the corresponding voltage in the precharged upper bit line $BL_{a1}$. The corresponding voltage, for example, 5 V is applied to the data input terminal of the sense amplifier 300, so that the sense amplifier 300 compares the two input voltages to amplify the voltage of the bit line $BL_{a1}$. In this way, the sense amplifier 300 amplifies the difference between the reference voltage level and the data voltage level, as illustrated in FIG. 8. The amplified voltage is transmitted through the data line D/01 when the signal $C_{data}$ for enabling the transmission transistor $S_1$ becomes high. Consequently, the operation for reading the data "1" from the memory cell $MC_1$ is sped up.

As described above, the present invention provides means for simplifying the semiconductor memory by eliminating the precharge and equalization circuits and pass gates, thereby increasing the integration density of the memory. In addition, the data read/write operation is sped up.

What is claimed is:

1. A ferroelectric semiconductor random access memory, comprising
   a memory cell array having a plurality of memory cells arranged in a matrix, each of the memory cells comprising an access transistor and a ferroelectric transistor;
   a plurality of bit lines connected with corresponding sense amplifiers; and
   a plurality of reference cells arranged symmetrically against the sense amplifiers for providing reference voltage to the reference input terminals of the sense amplifiers to sense the logical states of data stored in the memory cells,
   wherein the reference voltage is provided from one of the reference cells.

2. A ferroelectric semiconductor memory as recited in claim 1, wherein the bitlines are of an open bit line structure.

3. A ferroelectric semiconductor memory, comprising:
   a plurality of sense amplifiers connected to corresponding bit lines;
   a plurality of ferroelectric memory cells arranged symmetrically against the sense amplifiers and connected between the bit lines and plate lines; and
   a pair of reference cells arranged symmetrically against each of the sense amplifiers and connected with the bit lines so as to be outside the memory cells,
   wherein each of the reference cells comprises a capacitor with a capacitance equal to half the polarization capacitance of the ferroelectric capacitor of the memory cell, and
   wherein the reference voltage for the sense amplifier to sense the data of a selected memory cell in a data read mode is supplied at the half level of a binary data from the reference cell opposite to the selected memory cell with respect to the sense amplifier.

4. A ferroelectric semiconductor memory as recited in claim 3, wherein the bitlines are of an open bit line structure.

5. A ferroelectric semiconductor memory as recited in claim 3, wherein the capacitors in the reference cells are ferroelectric capacitors.

6. A ferroelectric semiconductor memory as recited in claim 5, wherein the contact size between the ferroelectric layer of the reference cell and an upper electrode of the reference cell is smaller than a contact size between that of the memory cell and the upper electrode.

7. A ferroelectric semiconductor memory as recited in claim 5, wherein the contact size between the ferroelectric layer of the reference cell and an upper electrode of the reference cell is greater than the contact size between that of the memory cell and the upper electrode.

8. A ferroelectric semiconductor memory as recited in claim 3, wherein the reference cells comprise MOS capacitors.

9. A method for sensing data from memory cells in a ferroelectric semiconductor random access memory including a memory cell array having a plurality of the memory cells arranged in a matrix, each of the memory cells having an access transistor, a ferroelectric capacitor, a plurality of bit lines of open bit line structure connected with corresponding sense amplifiers, and a plurality of reference cells arranged symmetrically against the sense amplifiers for providing reference voltage to the reference input terminals of the sense transistor to sense the logical states of the data stored in said memory cells, the method comprising the steps of:
   supplying a voltage representing a logical state of data stored in a selected memory cell to a sensing input of a sense amplifier;
   supplying a reference voltage to the sense amplifier; and
   comparing the voltage of the sensing input with the reference voltage to amplify the voltage difference between them,
   wherein the reference voltage for the sense amplifier is at half the level of a bit of binary data stored in a reference cell opposite to the selected memory cell with respect to the sense amplifier.

* * * * *